(12) United States Patent
Pincu et al.

(10) Patent No.: US 9,455,193 B2
(45) Date of Patent: Sep. 27, 2016

(54) INTEGRATED CIRCUIT INTERPOSER AND METHOD OF MANUFACTURING THE SAME

(71) Applicant: MARVELL ISRAEL (M.I.S.L) LTD., Yokneam (IL)

(72) Inventors: Carol Pincu, Rison Leziyon (IL); Ido Bourstein, Karkur (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 0 days.

(21) Appl. No.: 14/665,700

(22) Filed: Mar. 23, 2015

(65) Prior Publication Data
US 2015/0194414 A1 Jul. 9, 2015

Related U.S. Application Data

(62) Division of application No. 13/955,386, filed on Jul. 31, 2013, now Pat. No. 9,006,908.

(60) Provisional application No. 61/678,506, filed on Aug. 1, 2012, provisional application No. 61/694,151, filed on Aug. 28, 2012, provisional application No. 61/731,975, filed on Nov. 30, 2012.

(51) Int. Cl.
| | |
|---|---|
| H01L 21/82 | (2006.01) |
| H01L 25/065 | (2006.01) |
| H01L 21/822 | (2006.01) |
| H01L 23/12 | (2006.01) |
| H01L 23/498 | (2006.01) |
| H01L 23/544 | (2006.01) |
| H01L 23/14 | (2006.01) |
| H01L 23/538 | (2006.01) |
| H01L 21/48 | (2006.01) |

(Continued)

(52) U.S. Cl.
CPC ............ *H01L 21/82* (2013.01); *H01L 21/4857* (2013.01); *H01L 21/78* (2013.01); *H01L 21/8221* (2013.01); *H01L 23/12* (2013.01); *H01L 23/147* (2013.01); *H01L 23/49827* (2013.01); *H01L 23/49838* (2013.01); *H01L 23/5385* (2013.01); *H01L 23/544* (2013.01); *H01L 25/0655* (2013.01); *H01L 25/0657* (2013.01); *H01L 25/50* (2013.01); *H01L 2224/16225* (2013.01); *H01L 2924/157* (2013.01); *H01L 2924/15192* (2013.01); *H01L 2924/15311* (2013.01)

(58) Field of Classification Search
CPC . H01L 23/12; H01L 23/147; H01L 23/4926; H01L 23/498; H01L 23/49827; H01L 23/544; H01L 21/4803; H01L 21/78; H01L 21/82; H01L 21/8221
See application file for complete search history.

(56) References Cited

U.S. PATENT DOCUMENTS 6,930,378 B1    8/2005   St. Amand et al.
7,284,226 B1 *  10/2007  Kondapalli ..................... 326/41

(Continued)

Primary Examiner — Eduardo A Rodela

(57) ABSTRACT

Systems and methods are provided for an interposer for coupling two or more integrated circuit dies to a circuit package. A first integrated circuit portion is disposed on a first location of a single semiconductor substrate. A second integrated circuit portion is disposed on a second location of the single semiconductor substrate, where the second integrated circuit portion is electrically isolated from the first integrated circuit portion along a first axis. The first and second integrated circuit portions are configured to provide an electrical coupling to two or more corresponding top die integrated circuits across a second axis that is perpendicular to the first axis.

11 Claims, 14 Drawing Sheets

(51) Int. Cl.
*H01L 21/78* (2006.01)
*H01L 25/00* (2006.01)

(56) References Cited

U.S. PATENT DOCUMENTS

| | | |
|---|---|---|
| 8,105,875 B1 * | 1/2012 | Hu et al. .................. 438/107 |
| 8,258,810 B2 | 9/2012 | Or-Bach et al. |
| 8,501,590 B2 * | 8/2013 | Wang et al. ................. 438/462 |
| 8,828,848 B2 * | 9/2014 | Lin et al. ..................... 438/464 |
| 2004/0207078 A1 | 10/2004 | Su et al. |
| 2006/0087013 A1 * | 4/2006 | Hsieh .......................... 257/678 |
| 2010/0327457 A1 | 12/2010 | Mabuchi |
| 2012/0282735 A1 * | 11/2012 | Ahn et al. ..................... 438/109 |
| 2013/0009316 A1 * | 1/2013 | Wang et al. ................. 257/774 |
| 2013/0091315 A1 | 4/2013 | Ken et al. |

* cited by examiner

US 9,455,193 B2

INTEGRATED CIRCUIT INTERPOSER AND METHOD OF MANUFACTURING THE SAME

CROSS-REFERENCE TO RELATED APPLICATIONS

This is a division of U.S. application Ser. No. 13/955,386, filed Jul. 31, 2013, which claims priority from U.S. Provisional Application No. 61/678,506, filed Aug. 1, 2012, and U.S. Provisional Application No. 61/694,151, filed Aug. 28, 2012, and U.S. Provisional Application No. 61/731,975, filed Nov. 30, 2012. All of the above applications are hereby incorporated by reference.

FIELD

This disclosure is related generally to integrated circuit fabrication and more particular to integrated circuit interposer fabrication.

BACKGROUND

The maximum size of an integrated circuit die is typically limited by the reticle size of the photomask used during the integrated circuit fabrication process. Some devices, however, are approaching a practical size limitation, not maximal theoretical size, for manufacture on a single integrated circuit die. Interposers have been used in semiconductor device fabrication, for example, to route electrical interconnections between devices, to make high density chip package interfaces, to create devices from multiple smaller integrated circuit chips and the like.

The description above is presented as a general overview of related art in this field and should not be construed as an admission that any of the information it contains constitutes prior art against the present patent application.

SUMMARY

Systems and methods are provided for an interposer for coupling two or more integrated circuit dies to a circuit package. A first integrated circuit portion is disposed on a first location of a single semiconductor substrate. A second integrated circuit portion is disposed on a second location of the single semiconductor substrate, where the second integrated circuit portion is electrically isolated from the first integrated circuit portion along a first (isolation) axis. The first and second integrated circuit portions are configured to provide an electrical coupling to two or more corresponding top die integrated circuits across a second axis that is perpendicular to the first axis.

As another example, an integrated circuit package includes an interposer that includes a first integrated circuit portion disposed on a first location of a single semiconductor substrate and a second integrated circuit portion disposed on a second location of the single semiconductor substrate. The second integrated circuit portion is electrically isolated from the first circuit portion by an isolation axis that extends between the first and second integrated circuit portions. Two or more integrated circuit dies are electrically coupled to the first and second integrated circuit portions of the interposer across a second axis that is perpendicular to the isolation axis, where the first and second integrated circuit portions of the interposer each include patterns of electrical connections that electrically connect the two or more integrated circuit dies and that extend between the two or more integrated circuit dies in a direction parallel to the isolation axis.

As an additional example, a method of fabricating an interposer for coupling two or more integrated circuit dies to an integrated circuit package includes printing a first interposer portion at a first reticle position on an integrated circuit wafer substrate. A second interposer portion is printed at a second reticle position on the integrated circuit wafer substrate, the second reticle position being adjacent to the first reticle position. An isolation axis is provided between the first and second interposer portions on the integrated circuit wafer substrate, where the isolation axis electrically isolates the first interposer portion from the second interposer portion, and the integrated circuit wafer substrate is cut without cutting along the isolation axis to form an interposer that includes the first interposer portion and the second interposer portion.

DETAILED DESCRIPTION

Figure 1:
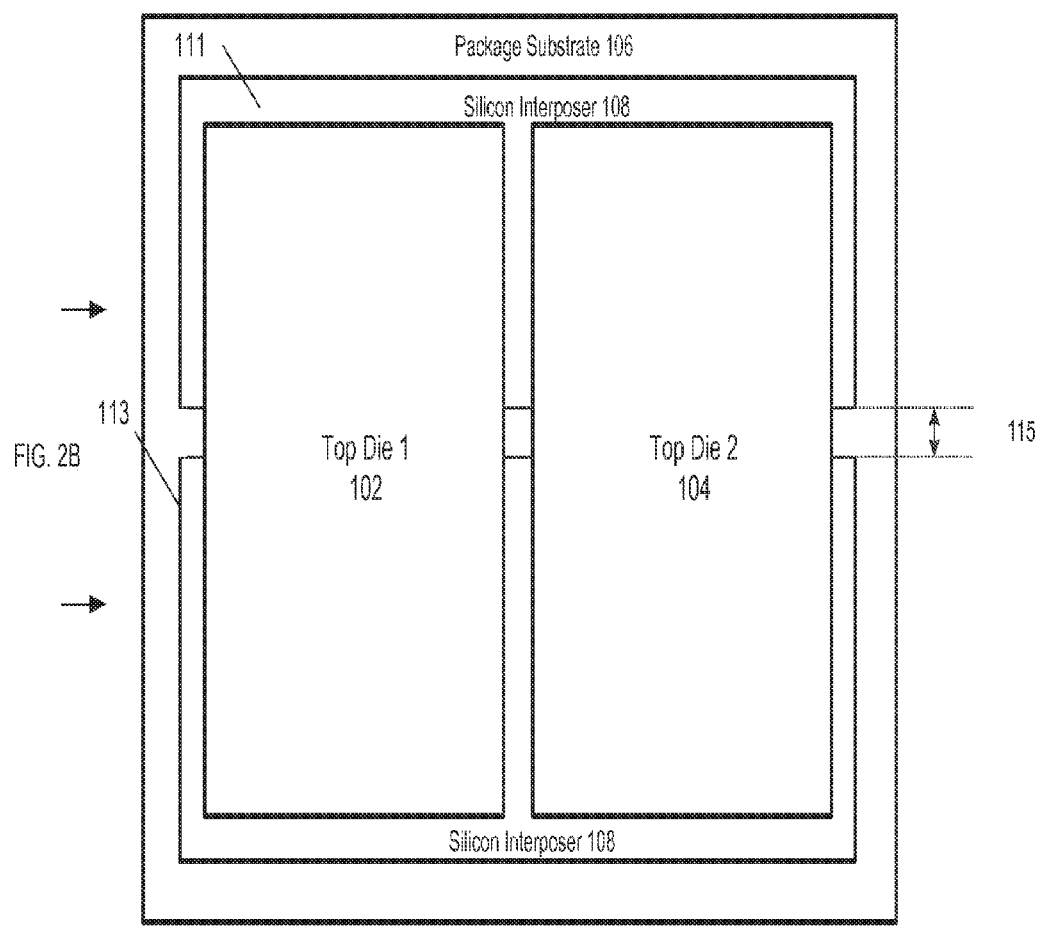
FIG. 1 is a top view of an example integrated circuit package that includes two integrated circuit die that are disposed on a package substrate via a silicon interposer in accordance with an embodiment of the present disclosure.

FIG. 1 is a top view of an example integrated circuit package 100 that includes two integrated circuit top die 102, 104 that are electrically coupled to a package substrate 106 via a silicon interposer 108 in one embodiment of the disclosure. As illustrated, the silicon interposer 108 includes a first integrated circuit portion 111 and a second integrated circuit portion 113, where the first and second top die integrated circuits 102, 104 are connected so as to span an isolation axis 115 that runs between the first and second interposer integrated circuit portions 111, 113.

Figure 2A:
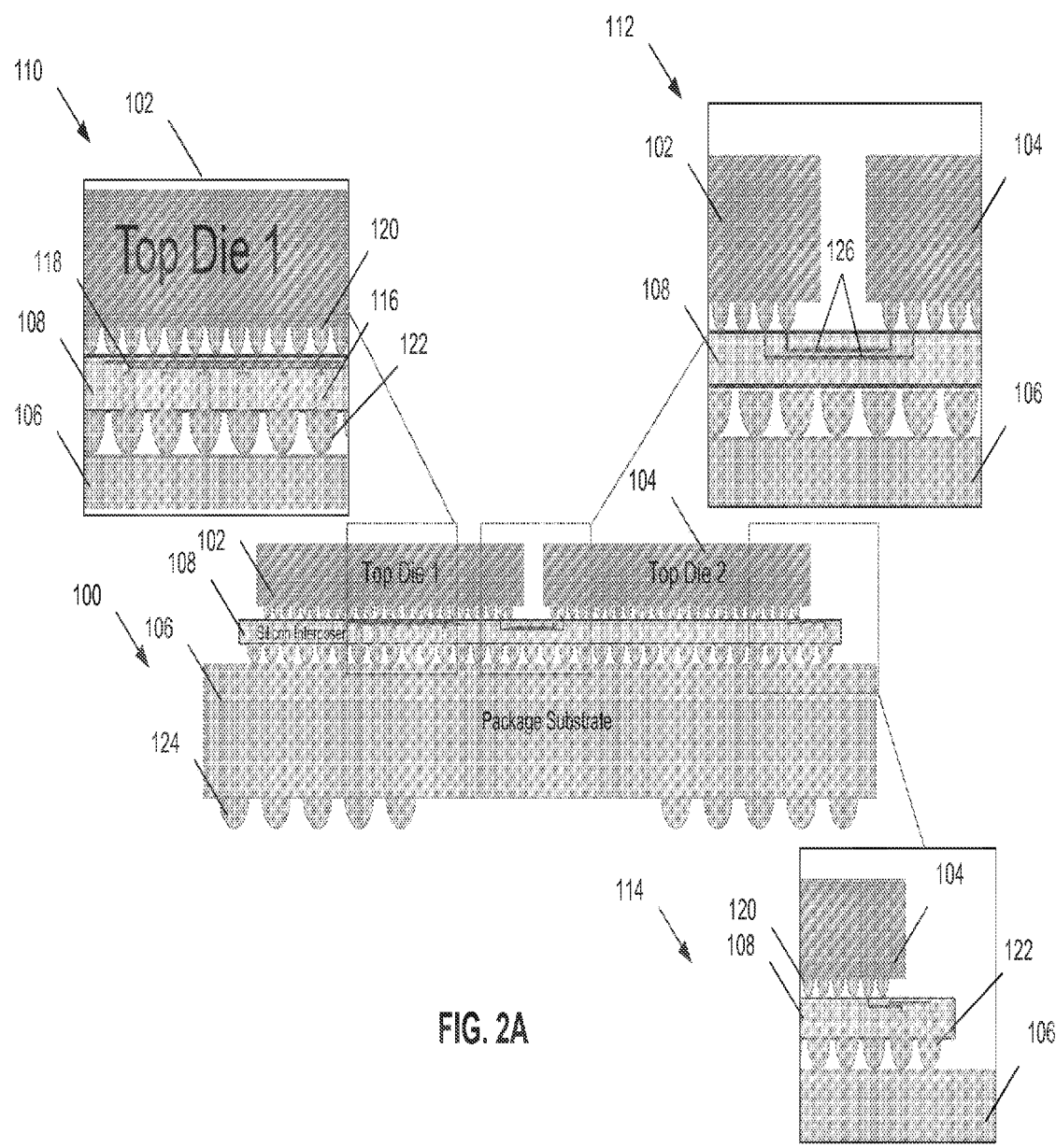
FIG. 2A is a cross-sectional view of the integrated circuit package seen in FIG. 1.

A cross-sectional view of the integrated circuit package 100 of one embodiment of the disclosure is illustrated in FIG. 2A. The cross-sectional view shown in FIG. 2A includes three magnified views 110, 112, 114 to illustrate examples of how the silicon interposer 108 electrically couples the two integrated circuit die 102, 104 to each other and to the package substrate. The silicon interposer 108 includes through-silicon vias (TSVs) 116 and interconnection traces 118 for electrically coupling connectors 120 (e.g., connector bumps, micro-bumps) on the integrated circuit die 102, 104 to connectors 122 (e.g., connector bumps) on a bottom surface of the silicon interposer 108. The silicon interposer connectors 122 are electrically coupled to connectors 124 (e.g., solder balls) on a bottom surface of the package substrate 106 by interconnection vias and layers (not shown) within the package substrate 106 for connection to external circuitry such as a printed circuit board. The interconnection traces 118, which pass through interposer 108, are also used to make electrical connections between two integrated circuit top die 102, 104, as shown in magnified view 112 at reference numeral 126.

For instance, the first magnified cross-sectional view 110 illustrates examples of electrical interconnections 116, 118 made between connectors 120 on a single integrated circuit die 102 and silicon interposer connectors 122. The second magnified view 112 illustrates examples of electrical interconnections 126 between two different integrated circuit die 102, 104 disposed on the silicon interposer 108. The third magnified view 114 illustrates examples of electrical interconnections between connectors 120 on the second integrated circuit die 104 and the silicon interposer connectors 122.

Figure 2B:
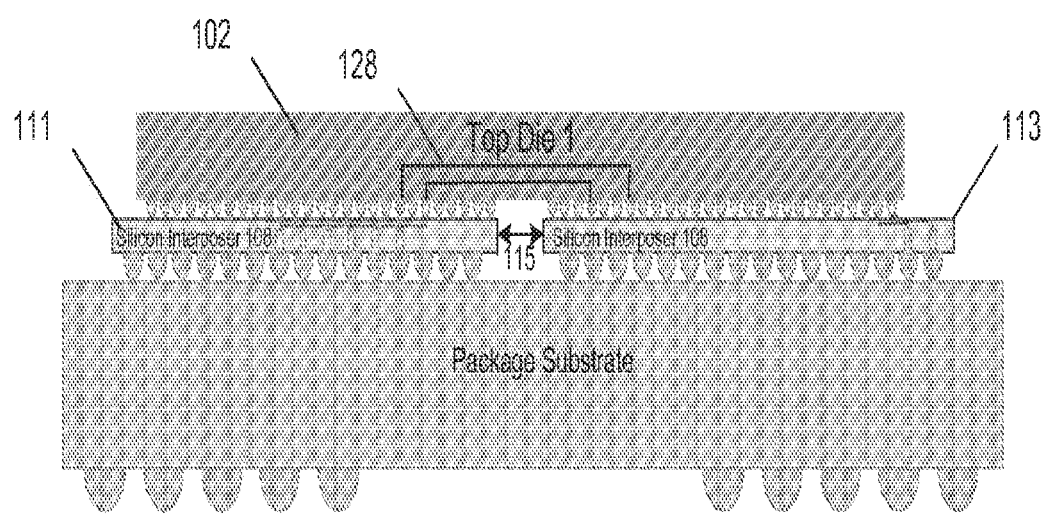
FIG. 2B is a second cross-sectional view of the integrated circuit package seen in FIG. 1.

FIG. 2B is a second cross-sectional view of the integrated package seen in FIG. 1. The cross-sectional view of FIG. 2B illustrates the first top die integrated circuit 102 being connected to the first integrated circuit portion 111 and the second integrated circuit portion 113 of the interposer 108 to facilitate communications across the isolation axis 115 that runs between the two interposer integrated circuit portions. As illustrated in FIG. 2B, those communication, in one embodiment of the disclosure, are facilitated by intra-die electrical connections 128, such as metal traces fabricated in one or more layers of the top die integrated circuit 102. In one embodiment of the disclosure, the second top die integrated circuit 104 (not shown) is similarly connected across the isolation axis 115. Thus, the configuration of FIGS. 2A and 2B enables connection between the first top die integrated circuit 102 and the second top die integrated circuit 104 by the intra-interposer 108 electrical connections 126, while connection between the first integrated circuit portion 111 of the interposer 108 and the second integrated circuit portion 113 of the interposer 108 are enabled by electrical connections 128 within the top die integrated circuits 102, 104.

Figure 3:
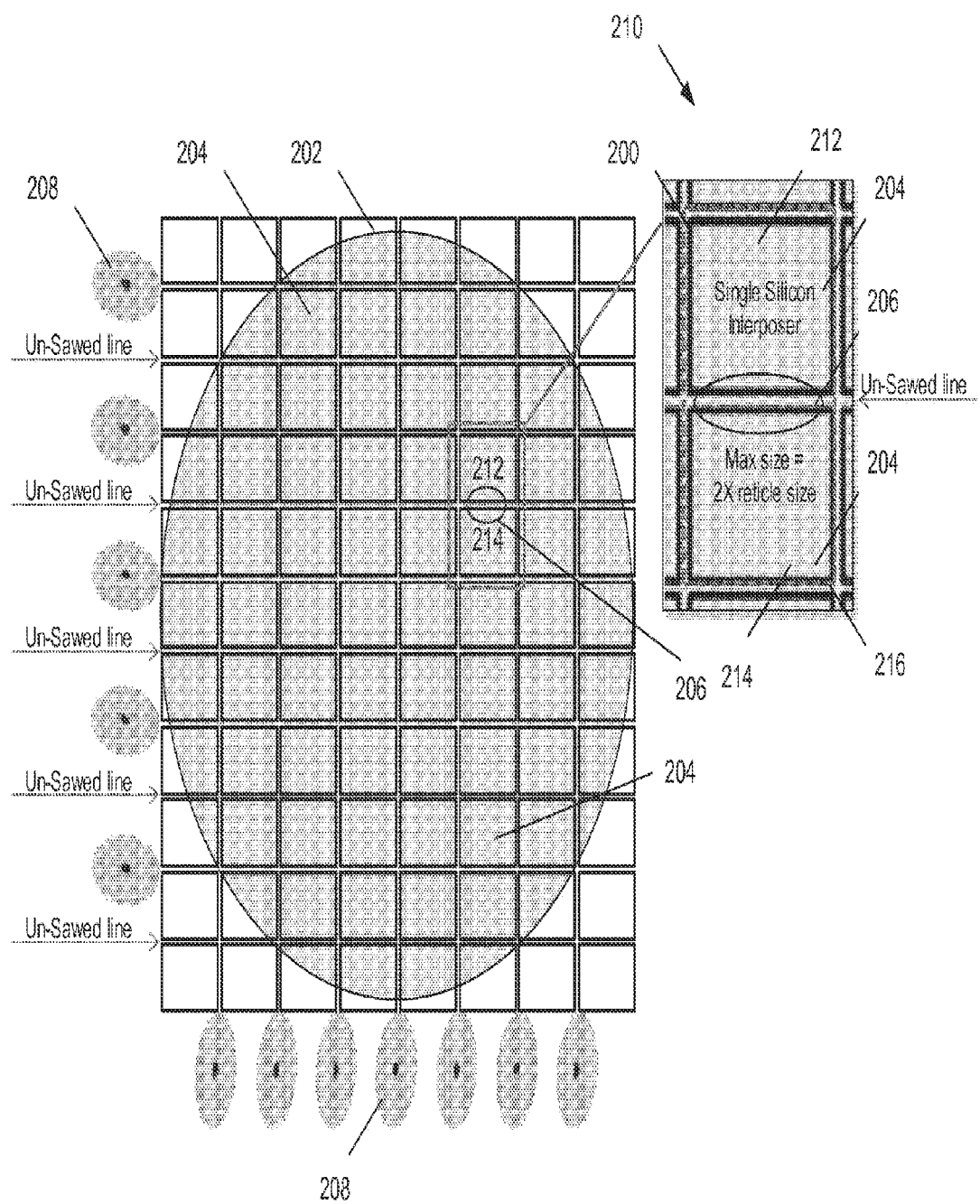
FIG. 3 illustrates a silicon wafer including a silicon interposer configured for interconnecting two or more integrated circuit die in accordance with the embodiment of FIG. 1.

FIG. 3 illustrates a silicon interposer 200 configured for interconnecting two or more integrated circuit die fabricated from a silicon wafer 202 in one embodiment of the disclosure. The area of active or passive components (such as TSVs and interconnection traces) that are patterned on a single die on a silicon wafer is limited by the reticle size of the photomask, indicated by the size of the reticle location rectangles 204 in FIG. 3, used in the photolithography process. In order to pattern multiple die on a wafer, a single die is patterned at a reticle location 204 and then the wafer 202, or exposure equipment, such as a stepper, is shifted to pattern another die, and so on. This process is repeated, as necessary, to add different patterns and/or layers of material, such as silicon and metal, to the die. The individual die at reticle locations 204 on the wafer 202 are physically and electrically isolated from one another, for example by forming a double ring seal 206 between reticle locations 204. In one embodiment of the disclosure, each reticle location 204 is surrounded by a ring seal, such that reticle locations 204 are separated from one another by two seals, one associated with each of the respective two reticle locations 204, and a section of silicon wafer 202 between the seals, sometimes referred to as a street. The die at the reticle locations 204 are then separated from the wafer 202 by cutting (i.e., dicing) the wafer between double ring seals 206, for example using a laser or diamond tipped saw 208.

To fabricate silicon interposers 200 that are large enough to interconnect two or more integrated circuit die, each silicon interposer 200 is fabricated using two adjacent reticle locations 204 on the silicon wafer 202. The isolation axis 206 (e.g., the double ring seal) between the two adjacent reticle locations 204 is left uncut in order to form a silicon interposer 200 that is more than twice the size of a single reticle location 204. An example is illustrated in the magnified view 210 shown in FIG. 3.

As shown in the magnified view 210, an interposer 200 for coupling two or more integrated circuit dies to an integrated circuit package is fabricated by printing a first interposer portion at a first reticle position 212 on an integrated circuit wafer substrate 202. A second interposer portion is printed at a second reticle position 214 on the integrated circuit wafer substrate 202, the second reticle position 214 being adjacent to the first reticle position 212. In one embodiment of the disclosure, the first and second interposer portions are formed contemporaneously, and in another embodiment of the disclosure, the first and second interposer portions are formed at different times, for example in interleaved steps. An isolation axis 206 is provided between the first and second interposer portions on the integrated circuit wafer substrate 202, the isolation axis 206 electrically isolating the first interposer portion 212 from the second interposer portion 214. The integrated circuit substrate 202 is cut without cutting along the isolation axis 206 to form an interposer 200 that includes the first interposer portion 212 and the second interposer portion 214. For example, in one embodiment of the disclosure, the interposer 200 is formed from two interposer portions formed at the first reticle position 212 and the second reticle position 214. After the first and second interposer portions are formed, the integrated circuit wafer substrate 202 is cut between the double ring seals 206, such as along dotted line 216 to extract the interposer 200 that spans the two interposer portions formed at the first reticle position 212 and the second reticle position 214.

Figure 4:
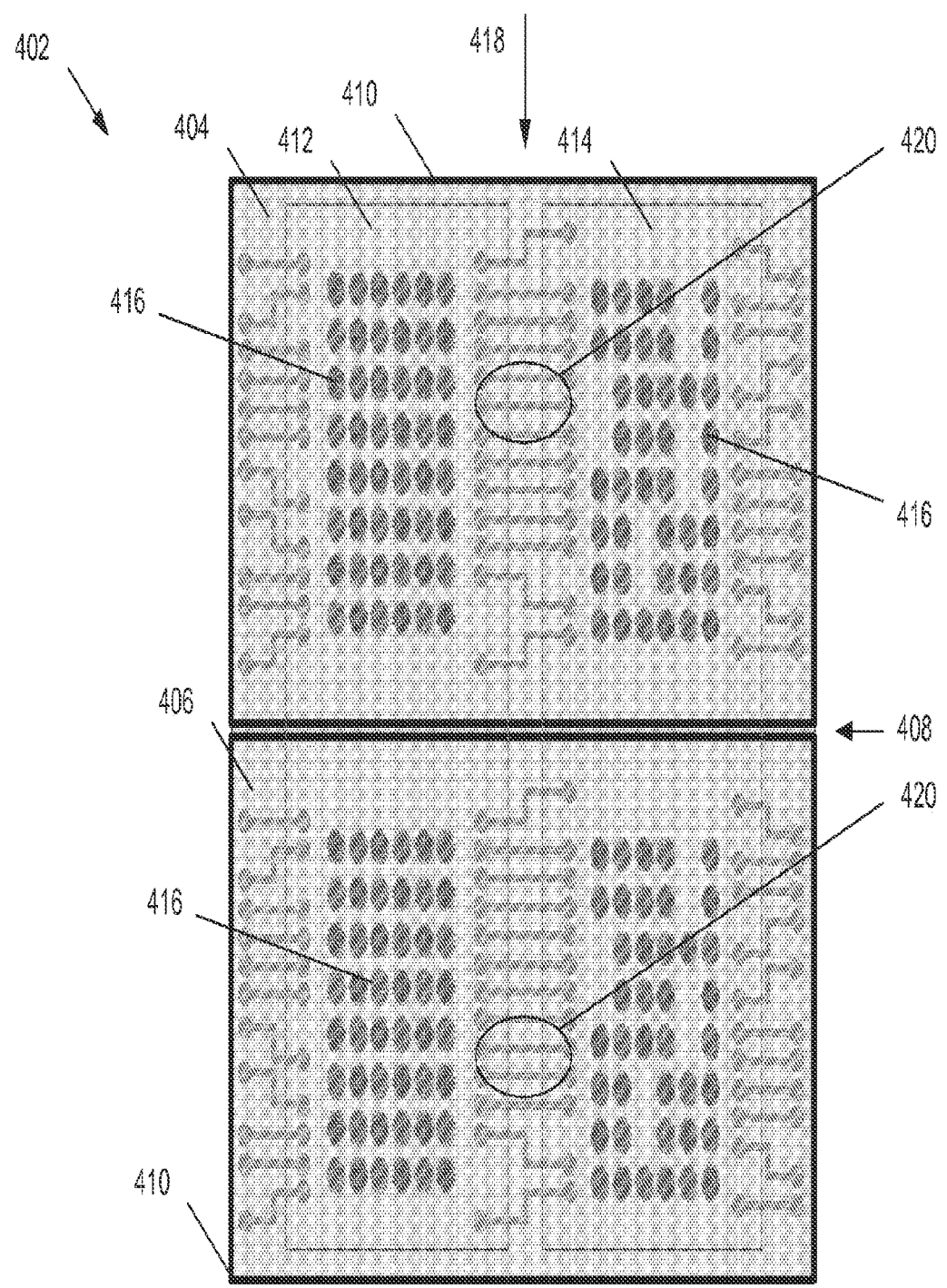
FIG. 4 is a diagram depicting example electrical interconnections of an integrated circuit package comprising an interposer and two or more integrated circuit dies in accordance with an embodiment of the disclosure.

FIG. 4 is a diagram depicting example electrical interconnections of an integrated circuit package comprising an interposer and two or more integrated circuit dies in accordance with an embodiment of the disclosure. The interposer 402 includes a first integrated circuit portion 404 disposed on a first location of a single semiconductor substrate. The interposer 402 further includes a second integrated circuit portion 406 disposed on a second, adjacent location of the single semiconductor substrate. The second integrated circuit portion 406 is electrically isolated from the first integrated circuit portion 404 along a first (isolation) axis 408. In one embodiment of the disclosure, the size of the first and second integrated circuit portions 404, 406 correspond to a reticle size of one or more reticle masks that are used to fabricate the first integrated circuit portion 404 and the second integrated circuit portion 406, respectively. Thus, the complete interposer 402 that includes the first integrated circuit portion 404 and the second integrated circuit portion 406 is larger in size than the reticle masks that are used to fabricate those portions 404, 406, respectively.

In one embodiment of the disclosure, the first integrated circuit portion 404 and the second integrated circuit portion 406 are electrically isolated by seal rings 410. During fabrication, a seal ring 410 is formed around the periphery of each of the integrated circuit portions 404, 406, with a street gap 408 being present between the seal rings 410 along the first axis 408. To separate the interposer 402 from the larger semiconductor substrate, streets surrounding the outside of the first integrated circuit portion 404 and the second integrated circuit portion 406 are cut, such as via a laser or saw, while the street along the first axis 408 remains un-scribed (uncut), resulting in electrical separation of the first and second integrated circuit portions 404, 406.

The first and second integrated circuit portions 404, 406 are configured to provide an electrical coupling to two or more corresponding top die integrated circuits 412, 414, respectively depicted as an outline, that are positioned so as to each span the first and second integrated circuit portions 404, 406 along a second axis 418 that is perpendicular to the first axis 408. The top die integrated circuits 412, 414 are electrically coupled to the interposer 402 via contacts 416 formed on the first and second integrated circuit portions 404, 406 of the interposer 402. For example, in one embodiment of the disclosure, electrically coupling connectors (e.g., connector bumps or micro-bumps) of the top die integrated circuits 412, 414 are matched to the contacts 416 to facilitate communications between the top die integrated circuits 412, 414 and other components via the interposer. In one embodiment of the disclosure, one or more of the first integrated circuit portion 404 and the second integrated circuit portion 406 of the interposer 402 are fabricated to include electrical connections 420 within the interposer integrated circuit portions 404, 406 that extend in a direction parallel to or substantially parallel to the first axis 408. Such connections in the corresponding portion of the interposer electrically couple the first top die integrated circuit 412 to the second top die integrated circuit 414, despite the respective top dies being otherwise electrically isolated from each other.

As noted previously, the first integrated circuit portion and the second integrated circuit portions 404, 406 of the interposer are electrically isolated from one another. The configuration of FIG. 4 enables communication, across the isolation barrier formed by street 408, between the two integrated circuit portions 404, 406 and any components connected thereto (as shown and described, for example, in FIG. 10) by way of internal connections formed in the first top die integrated circuit 412 and/or the second top die integrated circuit 414. Thus, the first and second top die integrated circuits 412, 414 are connected by the intra-interposer electrical connections 420, and the first and second integrated circuit portions 404, 406 are connected through internal electrical couplings formed in one or more internal layers of the first and second top die integrated circuits 412, 414.

In one embodiment of the disclosure, depicted in FIG. 4, the pattern of top die integrated circuit contacts 416 and other internal connections (e.g., at 420) are the same for both the first integrated circuit portion 404 and the second integrated circuit portion 406 of the interposer 402. In such an embodiment, all of the reticle locations of a silicon wafer substrate, such as those shown at 204 in FIG. 3, are formed according to the same fabrication pattern. In other embodiments, integrated circuit portion fabrication patterns differ across reticle locations of a substrate.

Figure 5:
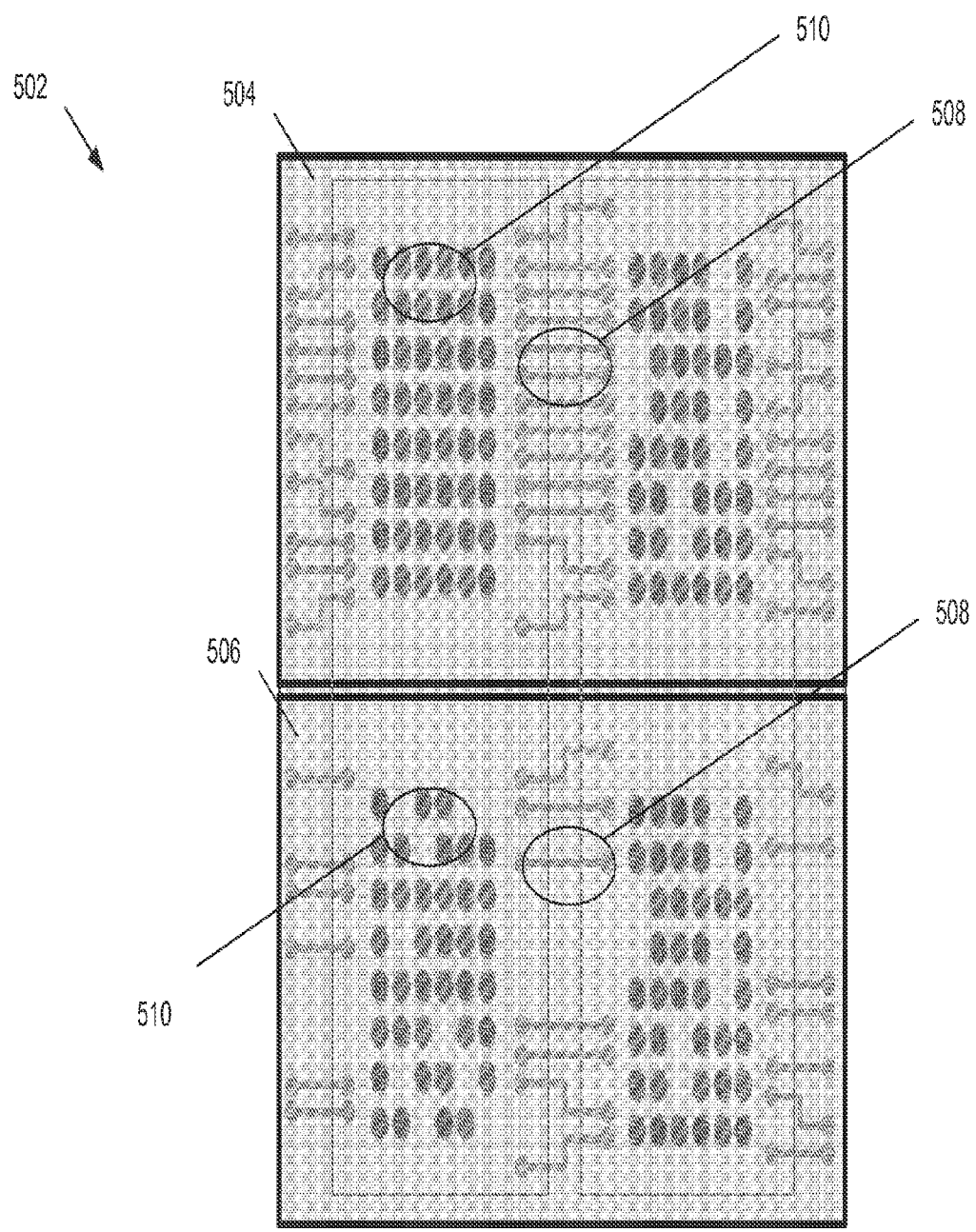
FIG. 5 is a diagram depicting example electrical interconnections of an integrated circuit package comprising an interposer and two or more integrated circuit dies in accordance with another embodiment of the disclosure.

FIG. 5 is a diagram depicting an interposer, similar to the interposer seen in FIG. 4, for coupling two or more integrated circuit dies to a circuit package using non-matching interposer integrated circuit portions in one embodiment of the disclosure. FIG. 5 discloses an interposer 502 that comprises a first integrated circuit portion 504 and a second integrated circuit portion 506 that are electrically separated from one another. In FIG. 5, the patterns of intra-interposer electrical connections 508 and top die integrated circuit contacts 510 differ between the first integrated circuit portion 504 and the second integrated circuit portion 506, such that all of the reticle locations of a silicon wafer substrate cannot be fabricated identically. In such an embodiment of the disclosure, certain reticle locations on the silicon substrate are formed according to a first fabrication pattern corresponding to the first integrated circuit portion 504 pattern, while neighboring reticle locations are formed according to a second fabrication pattern corresponding to the second integrated circuit 506 pattern, as described in further detail with respect to FIG. 6.

Figure 6:
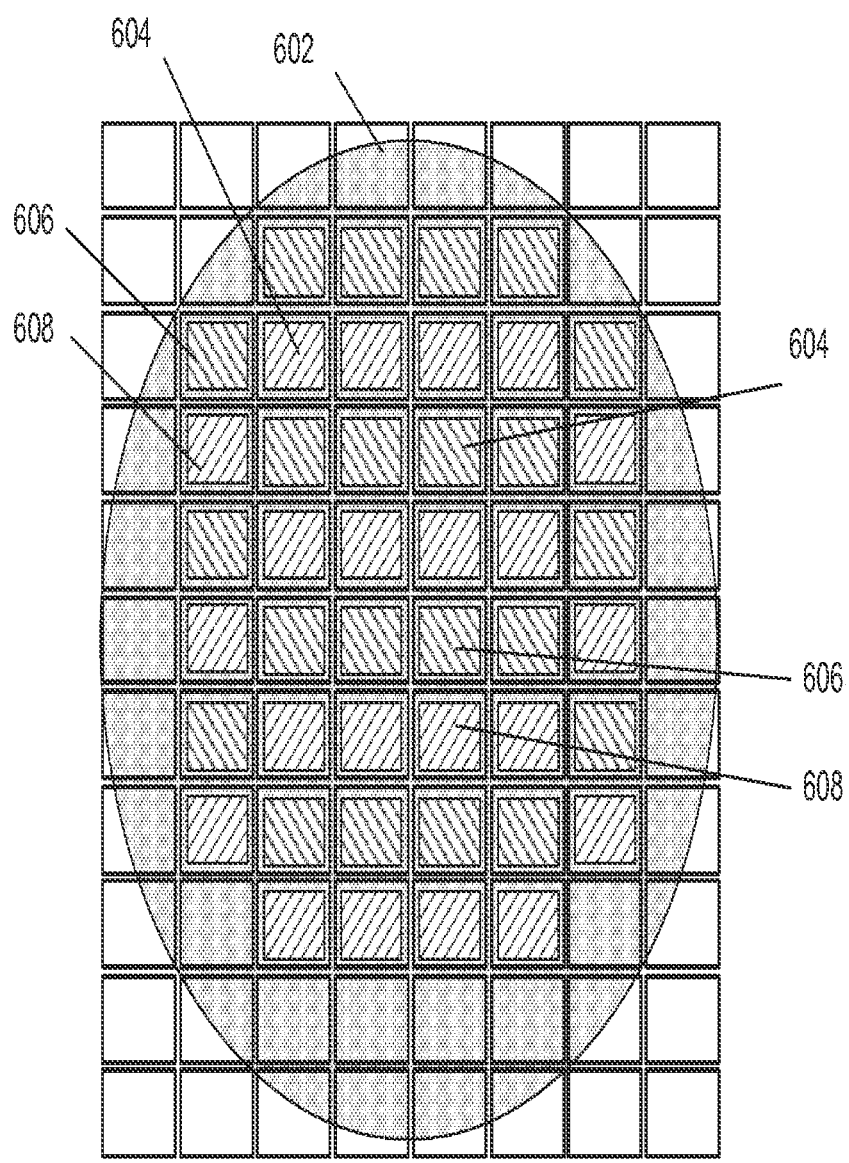
FIG. 6 is a diagram depicting formulation of different integrated circuit portions at reticle locations of a semiconductor wafer in accordance with an embodiment of the disclosure.

FIGS. 6-9 describe an example process for manufacturing an integrated circuit package. FIG. 6 is a diagram depicting formulation of differing integrated circuit portions at reticle locations of a substrate in one embodiment of the disclosure. FIG. 6 depicts a silicon substrate 602 and a number of reticle locations 604 defined thereon and represented by the rectangular boxes. Certain reticle locations 604 of the substrate 602 are designated for fabrication of an integrated circuit portion of an interposer. In the embodiment of FIG. 6, first integrated circuit portions 606 of the interposer (represented by northwest-to-southeast diagonal lines) are to be fabricated according to a different pattern than second integrated circuit portions 608 (represented by southwest-to-northeast diagonal lines). In one embodiment of the disclosure, fabrication of the integrated circuit portions includes fabricating seal rings around the perimeter of each integrated circuit portion. Once the integrated circuit portions 606, 608 are fabricated, they are tested to determine whether that fabrication was successful.

Figure 7:
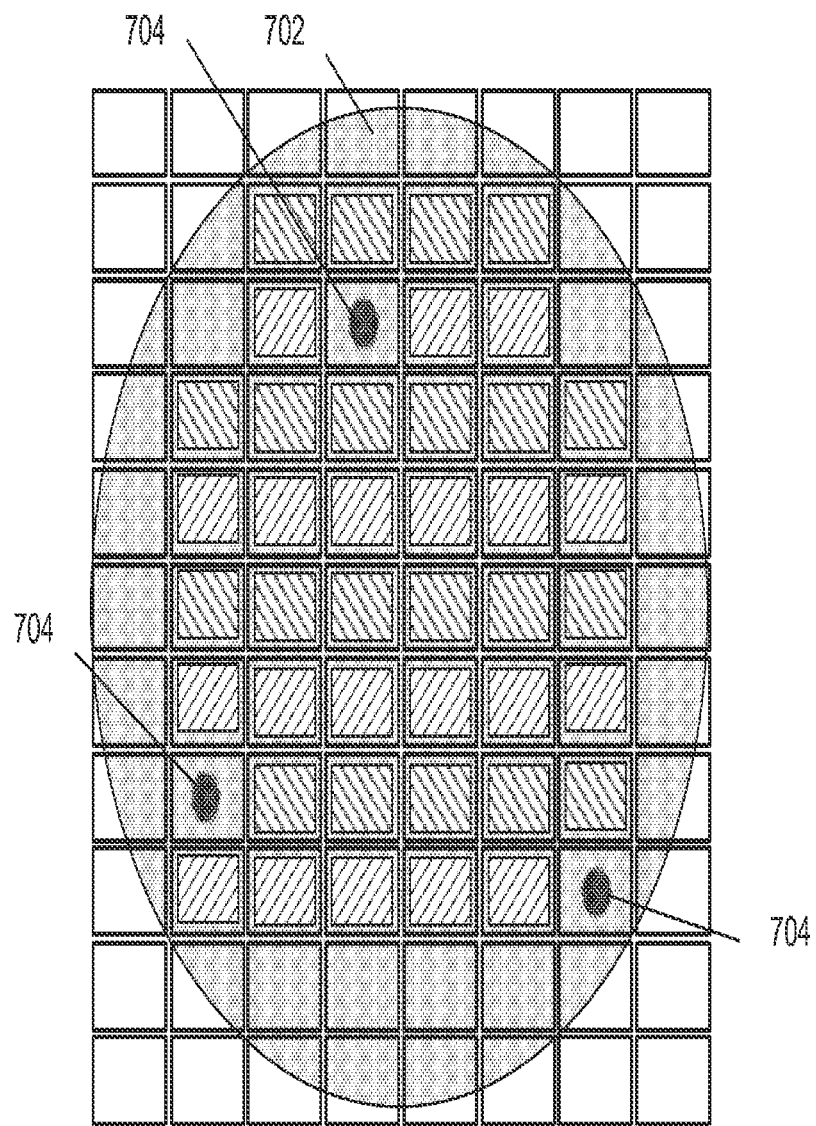
FIG. 7 is a diagram depicting example interposer integrated circuit portion testing results in accordance with embodiment of the disclosure.

FIG. 7 is a diagram depicting example interposer integrated circuit portion testing results in one embodiment of the disclosure. After forming the interposer integrated circuit portions on the substrate 702, those integrated circuit portions are tested to determine whether or not the respective patterns were correctly formed. Certain integrated circuit portions, where testing indicated fabrication failure, are noted at 704. By testing for interposer integrated circuit portion fabrication failures, integrated circuit package manufacture costs are reduced, as, in one embodiment of the disclosure, interposers having integrated circuit portions identified as failing the fabrication testing will not have top die integrated circuits installed thereon.

Figure 8:
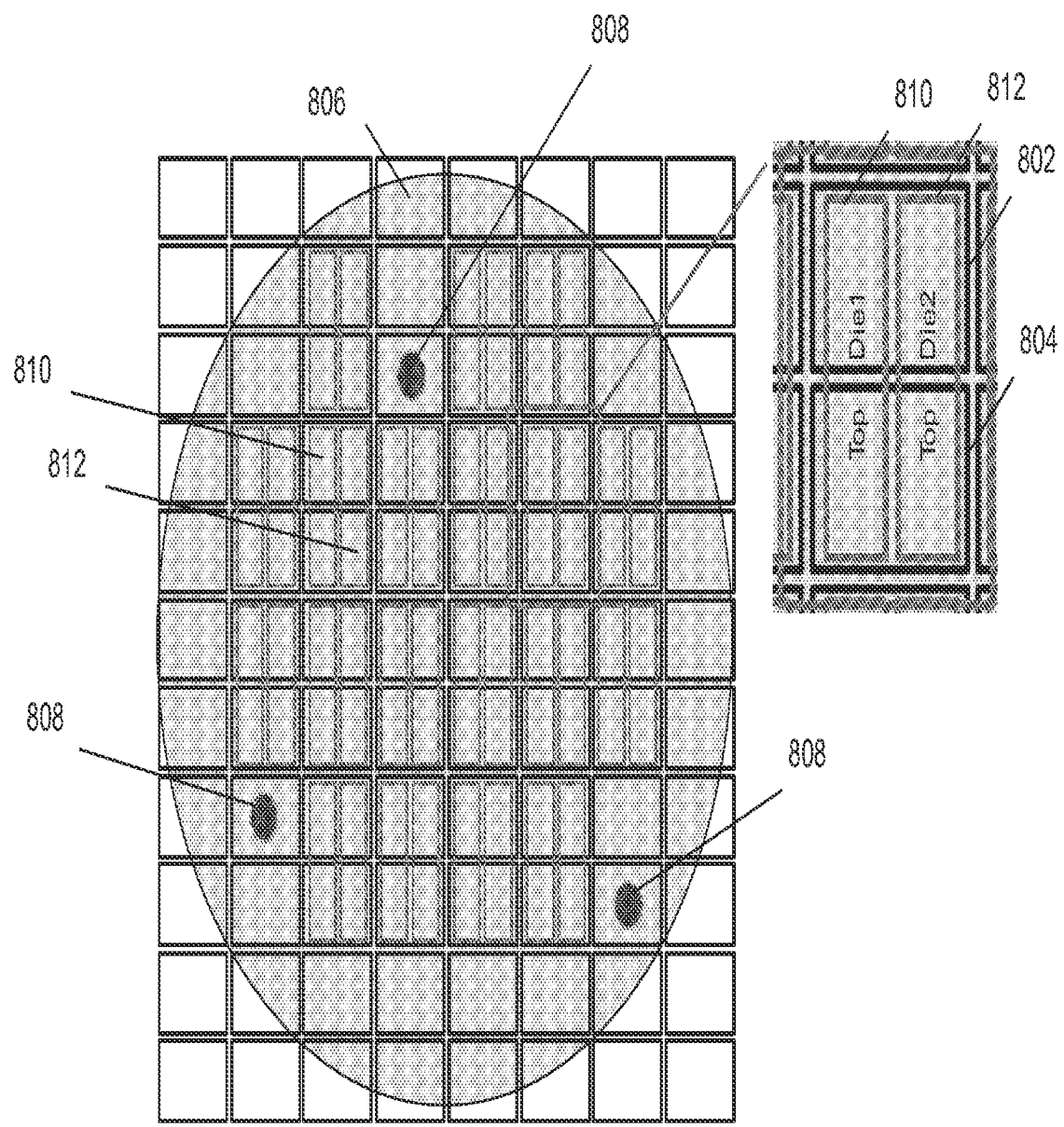
FIG. 8 is a diagram depicting positions for installation of top die integrated circuits.

FIG. 8 is a diagram depicting positions for installation of top die integrated circuits. Reticle locations of first integrated circuit portion 802—second integrated circuit portion 804 pairs are identified on the substrate 806, where neither integrated circuit portion 802, 804 was identified as a fabrication failure 808. In one embodiment of the disclosure, a first top die integrated circuit 810 and a second top die integrated circuit 812 are positioned across each of the identified pairs and electrically coupled (connected) to the pairs prior to dicing the interposers from the substrate 806. In another embodiments of the disclosure, the interposers comprising the integrated circuit portion pairs are cut apart prior to attaching the top die integrated circuits.

Figure 9:
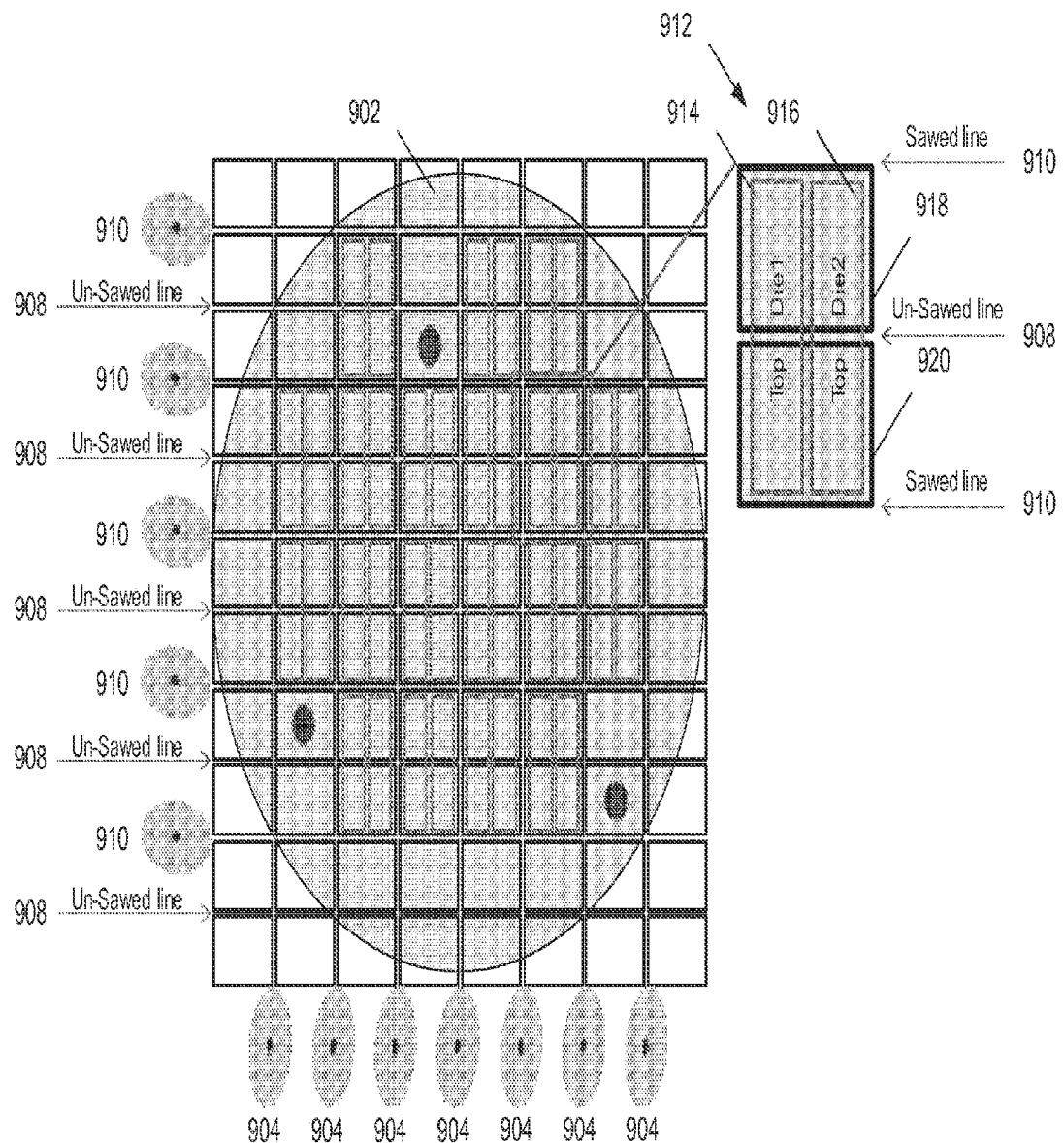
FIG. 9 is a diagram depicting dicing of interposers from a tested wafer in accordance with an embodiment of the disclosure.

FIG. 9 is a diagram depicting dicing interposers from the substrate. In a dicing operation in one embodiment of the disclosure, lasers, diamond tipped saw or other suitable cutting devices are used to cut the substrate 902 along certain of the streets between reticle locations (e.g., streets between reticle location seal rings). Because the interposers comprise integrated circuit portions at more than one reticle location, cuts (scribes) are not made along all of the streets. In the embodiment of FIG. 9, cuts are made along each of the vertical streets 904, and every other horizontal street, leaving un-sawed lines 908 in between the cut streets 910 such that individual interposers 912 are formed that each comprise a first top die integrated circuit 914 and a second top die integrated circuit 916 connected across a first integrated circuit portion 918 and a second integrated circuit portion 920, where the first and second integrated circuit portions 918, 920 are electrically isolated by an isolation axis along the unsawed line 908, perpendicular to the placement of the first and second top die integrated circuits 914, 916.

Figure 10:
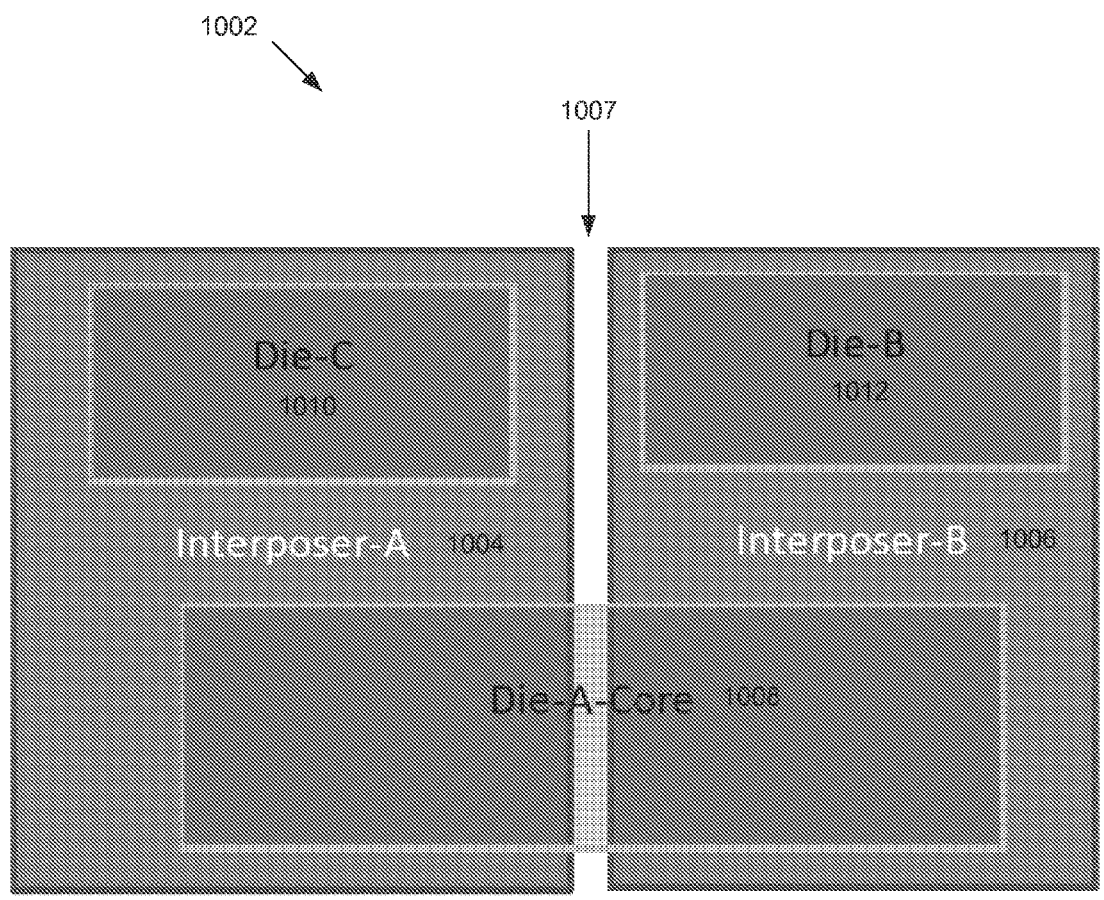
FIG. 10 is a block diagram depicting the connection of three circuit components using two interposer portions in accordance with another embodiment of the disclosure.

In addition to connecting two interposer portions using two top die integrated circuits, as disclosed in the preceding examples, other embodiments of the disclosure include other configurations. FIG. 10 is a block diagram depicting the connection of three circuit components using two interposer portions in an integrated circuit package, where certain of the circuit components are connected to wholly separate interposer portions. In the example of FIG. 10, an interposer 1002 includes an interposer integrated circuit portion A 1004 and an interposer integrated circuit portion B 1006 separated along an isolation axis 1007. A first component 1008 of the integrated circuit package bridges interposer portion A 1004 and interposer portion B 1006, facilitating communication among components connected to the interposer 1002 through internal electrical connections of the first component 1008 that bridges the isolated interposer portions 1004, 1006. While the first component 1008 includes internal connections for bridging communications across the isolated interposer portions 1004, 1006, in one embodiment of the disclosure, a second component 1010 and a third component 1012 do not include such interposer-linking internal electrical connections.

In one embodiment of the disclosure, the second component 1010 is connected only to interposer portion A 1004, and the third component 1012 is connected only to interposer portion B 1006. Communications between the second component 1010 and the first component 1008 are facilitated via intra-interposer portion connections of interposer portion A 1004, and communications between the third component 1012 and the first component 1008 are facilitated via intra-interposer portion connections of interposer portion B 1006. Thus, in one embodiment of the disclosure, the second component 1010 is configured to communicate with the third component 1012 via a communication path that includes interposer portion A 1004, the first component 1008, and interposer portion B 1006.

Components 1008, 1010, 1012 take a variety of forms. For example, in one embodiment of the disclosure, the second component 1010 is a top die integrated circuit processor component, and the third component 1012 is a top die integrated circuit memory component. In another embodiment of the disclosure, the second component 1010 is a top die I/O integrated circuit component, and the third component 1012 is a top die integrated circuit memory component.

Figure 11:
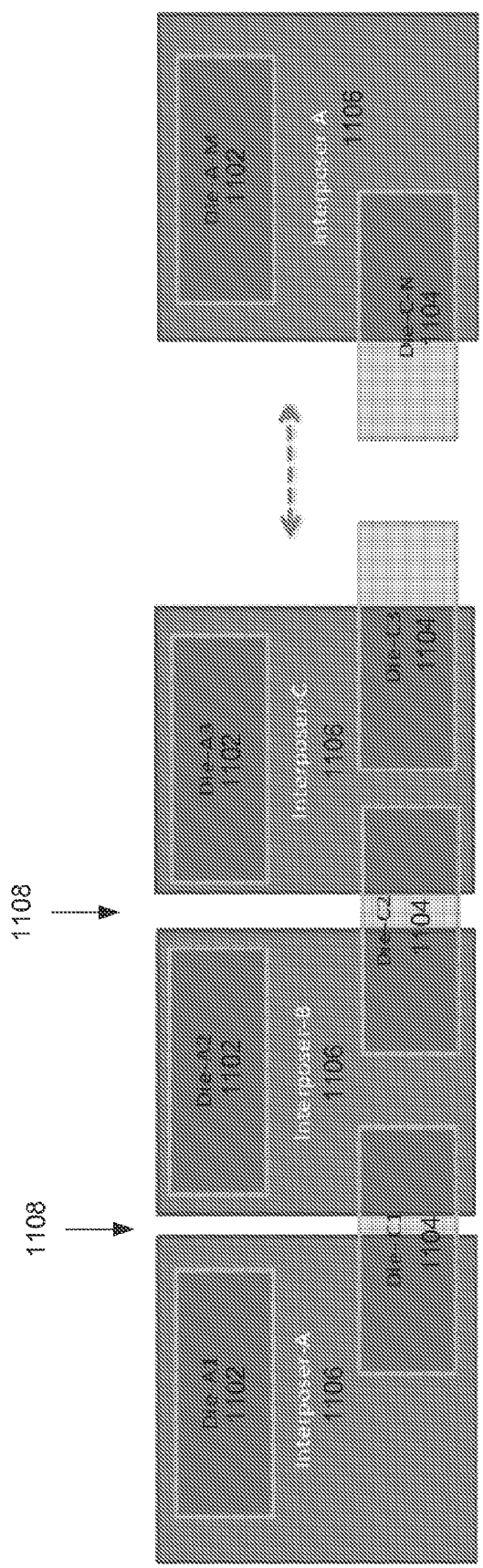
FIG. 11 is a block diagram depicting the connection of n circuit components using m interposer portions in an integrated circuit package.

FIG. 11 is a block diagram depicting the connection of n circuit components using m interposer portions in an integrated circuit package. In the example of FIG. 11, a number of integrated circuit components are connected using a number of interposer portions. In one embodiment of the disclosure, one circuit component 1102 is connected to each interposer portion 1006 in an exclusive manner, while circuit components 1104 are positioned to bridge communications across the interposer portions 1106. Thus, in one embodiment of the disclosure, n exclusively connected circuit components and n−1 bridging circuit components communicate across n interposer portions. In one embodiment of the disclosure, the interposer portions 1106 are formed from a single semiconductor substrate and are electrically isolated from one another by parallel isolation axes 1108 defined by seal rings.

In other embodiments of the disclosure, different numbers and configurations of circuit components and interposer portions are utilized. In the example of FIG. 11, the interposer portions 1106 are positioned in a linear fashion. In other embodiments of the disclosure, interposer portions 1106 are positioned in a two-dimensional array with bridging circuit components 1104 connecting those interposer portions 1106 vertically and horizontally, or in a snaking fashion. In such an embodiment, a first set of isolation axes are parallel to one another while a second set of isolation axes are perpendicular to the first set of isolation axes. In still other embodiments of the disclosure, multiple circuit components 1102 are connected to one or more of the interposer portions 1106.

Figure 12:
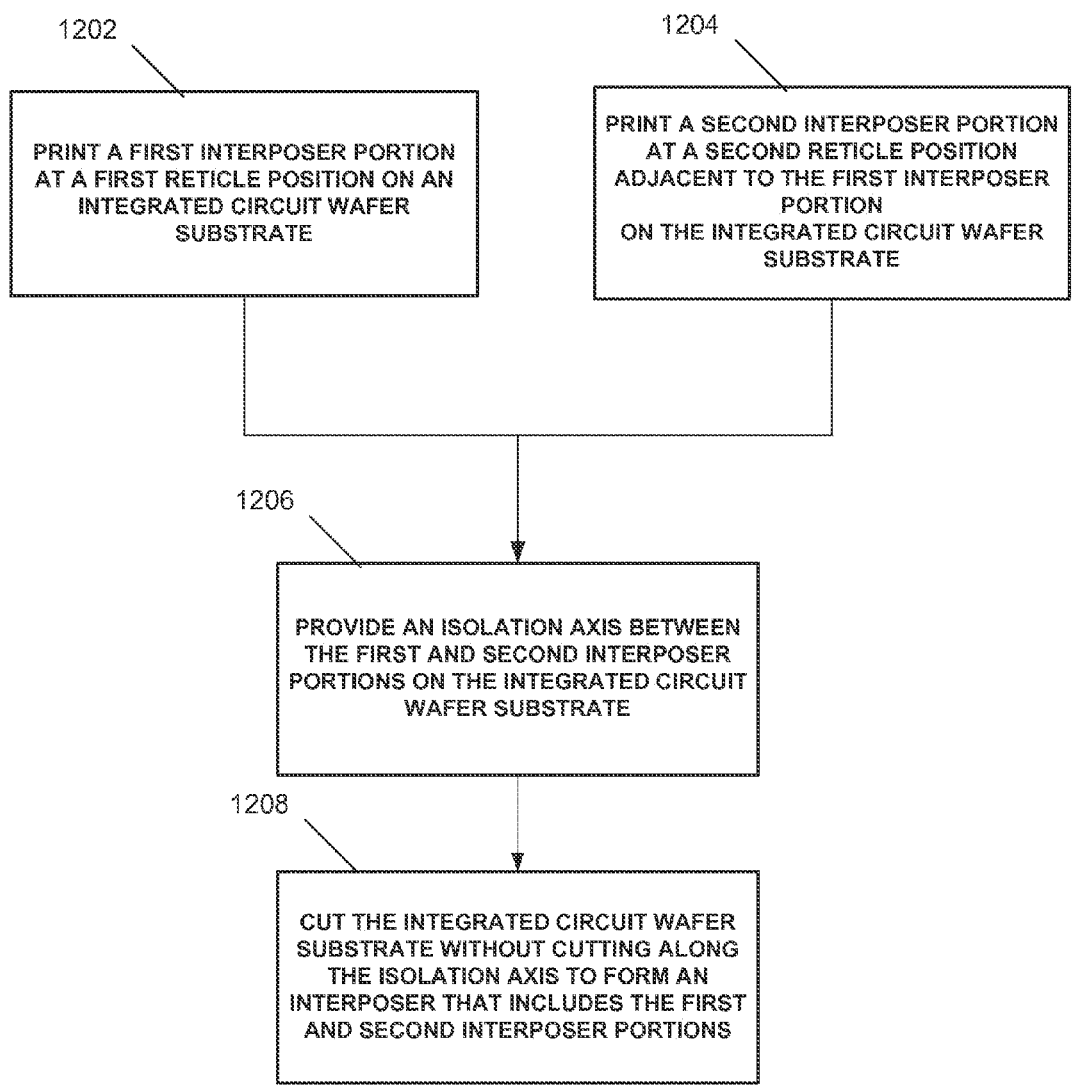
FIG. 12 is a flow diagram depicting a method of fabricating an interposer for coupling two or more integrated circuit dies to an integrated circuit package in accordance with an embodiment of the disclosure.

FIG. 12 is a flow diagram depicting a method of fabricating an interposer for coupling two or more integrated circuit dies to an integrated circuit package. At 1202, a first interposer portion is printed at a first reticle position on an integrated circuit wafer substrate, and at 1204, a second interposer portion is printed at a second reticle position on the integrated circuit wafer substrate, the second reticle position being adjacent the first reticle position. In the example of FIG. 12, the first and second interposer portions are printed contemporaneously. In other embodiments of the disclosure, the first and second interposer portions are printed at different times. At 1206, an isolation axis is provided between the first and second interposer portions on the integrated circuit wafer substrate, where the isolation axis electrically isolates the first interposer portion from the second interposer portion, in an embodiment. At 1208, the integrated circuit wafer substrate is cut without cutting along the isolation axis to form an interposer that includes the first interposer portion and the second interposer portion.

Figure 13:
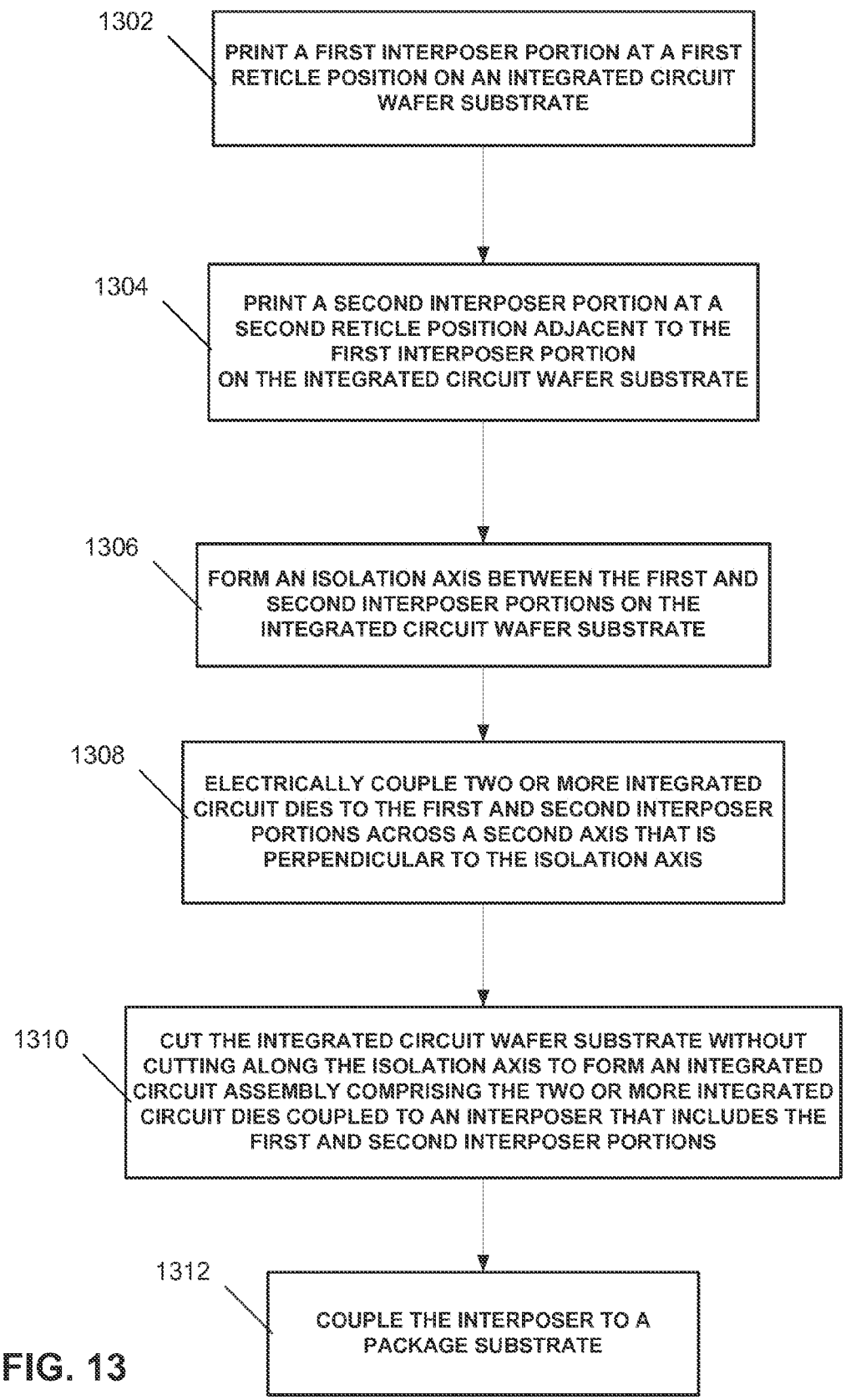
FIG. 13 is a flow diagram depicting a method of fabricating an integrated circuit package in accordance with an embodiment of the disclosure.

FIG. 13 is a flow diagram depicting a method of fabricating an integrated circuit package. At 1302, a first interposer portion is printed at a first reticle position on an integrated circuit wafer substrate. At 1304, a second interposer portion is printed at a second reticle position on the integrated circuit wafer substrate. An isolation axis is provided at 1306 between the first and second interposer portions on the integrated circuit wafer substrate, the isolation axis electrically isolating the first interposer portion from the second interposer portion. At 1308, two or more integrated circuit dies are electrically coupled to the first and second interposer portions of the interposer across a second axis that is perpendicular to the isolation axis. In one embodiment of the disclosure, the coupling of the one or more integrated circuit dies provides electrical connection of the first and second interposer portions through internal electrical connections of the one or more integrated circuit dies, while communications between the one or more integrated circuit dies are facilitated by intra-interposer portion electrical connections. At 1310, the integrated circuit wafer substrate is cut without cutting along the isolation axis to form an integrated circuit assembly comprising the two or more integrated circuit dies electrically coupled to an interposer that includes the first interposer portion and the second interposer portion, and at 1312, the interposer is coupled to a package substrate to form the integrated circuit package. In the embodiment of FIG. 13, the two or more integrated circuit dies are electrically coupled to the first and second interposer portions prior to cutting the integrated circuit wafer substrate. In other embodiments of the disclosure, the substrate is cut prior to electrically coupling the integrated circuit dies, where the top die integrated circuits are mounted onto the interposers after dicing of the top dies and dicing of the interposers.

This application uses examples to illustrate the invention. The patentable scope of the invention includes other examples.

The invention claimed is:

1. A method of fabricating an interposer for coupling two or more integrated circuit dies to an integrated circuit package, the method comprising;
   printing a first portion of the interposer at a position of a first reticle on an integrated circuit wafer substrate;
   printing a second portion of the interposer at a position of a second reticle on the integrated circuit wafer substrate, the position of the second reticle being adjacent the position of the first reticle;
   providing an isolation axis between the first portion of the interposer and the second portion of the interposer on the integrated circuit wafer substrate, the isolation axis electrically isolating the first portion of the interposer from the second portion of the interposer; and
   cutting the integrated circuit wafer substrate without cutting along the isolation axis to form an interposer that includes both the first portion of the interposer and the second portion of the interposer;
   wherein the first portion of the interposer and the second portion of the interposer are fabricated using a reticle mask such that a combined size of the first portion of the interposer and the second portion of the interposer is larger a than reticle size of the reticle mask.

2. The method of claim 1, wherein the interposer is configured to provide an electrical coupling between the two or more integrated circuit dies across a second axis that is perpendicular to the isolation axis.

3. The method of claim 2, wherein the first portion of the interposer and the second portion of the interposer each include patterns of electrical connections for electrically connecting the two or more corresponding top die portions, the patterns of electrical connections each extending in a direction parallel to the isolation axis.

4. The method of claim 2, wherein the first portion of the interposer and the second portion of the interposer are fabricated using the same reticle mask for generating a pattern of electrical connections for electrically connecting the two or more corresponding top die integrated circuits.

5. The method of claim 2, wherein the first portion of the interposer and the second portion of the interposer are fabricated using the different reticle masks such that the first portion of the interposer and the second portion of the interposer each include a different pattern of electrical connections for electrically connecting the two or more corresponding top die integrated circuits.

6. The method of claim 1, further comprising:
   fabricating the first portion of the interposer and the second portion of the interposer using a reticle mask such that a size of each of the first portion of the interposer and the second portion of the interposer corresponds to a reticle size of the reticle mask.

7. The method of claim 1, wherein the isolation axis comprises an internal double seal ring.

8. The method of claim 1, wherein the first portion of the interposer and the second portion of the interposer are printed contemporaneously.

9. A method of fabricating an integrated circuit package, comprising:
   printing a first portion of an interposer at a position of a first reticle on an integrated circuit wafer substrate;
   printing a second portion of the interposer at a position of a second reticle on the integrated circuit wafer substrate;
   providing an isolation axis between the first portion of the interposer and the second portion of the interposer on the integrated circuit wafer substrate, the isolation axis electrically isolating the first portion of the interposer from the second portion of the interposer;
   electrically coupling two or more integrated circuit dies to the first portion of the interposer and the second portion of the interposer across a second axis that is perpendicular to the isolation axis;
   cutting the integrated circuit wafer substrate without cutting along the isolation axis to form an integrated circuit assembly comprising the two or more integrated circuit dies electrically coupled to the interposer; and
   coupling the interposer to a package substrate to form the integrated circuit package.

10. The method of claim 9, wherein the cutting comprises a dicing procedure that utilizes a diamond saw or a laser.

11. A method of fabricating an integrated circuit package, comprising:
   printing a first portion of an interposer at a position of a first reticle on an integrated circuit wafer substrate;
   printing a second portion of the interposer at a position of a second reticle on the integrated circuit wafer substrate;
   providing an isolation axis between the first portion of the interposer and the second portion of the interposer on the integrated circuit wafer substrate, the isolation axis electrically isolating the first portion of the interposer from the second portion of the interposer;
   cutting the integrated circuit wafer substrate without cutting along the isolation axis;
   electrically coupling two or more integrated circuit dies to the first portion of the interposer and the second portion of the interposer across a second axis that is perpendicular to the isolation axis to form an integrated circuit assembly comprising the two or more integrated circuit dies electrically coupled to the interposer; and
   coupling the interposer to a package substrate to form the integrated circuit package.

* * * * *